US012777620B2

(12) United States Patent
Peterman et al.

(10) Patent No.: US 12,777,620 B2
(45) Date of Patent: Oct. 27, 2026

(54) ELECTRONIC DEVICES INCLUDING AN INDICIUM WITH A THERMAL CONDUIT

(71) Applicant: Apple Inc., Cupertino, CA (US)

(72) Inventors: Andrew N. Peterman, San Francisco, CA (US); Brian M. Gable, Monte Sereno, CA (US); Carlo Catalano, Santa Cruz, CA (US); Dennis T. Mo, San Jose, CA (US); Eric W. Hamann, Cedar Park, TX (US); Erik A. Uttermann, San Francisco, CA (US); James A. Stryker, Sr., Campbell, CA (US); Manojkumar K. Singh, Cupertino, CA (US); Nagarajan Kalyanasundaram, Los Gatos, CA (US); Sachin Kasetti, San Francisco, CA (US); William A. Counts, Austin, TX (US)

(73) Assignee: Apple Inc., Cupertino, CA (US)

( * ) Notice: Subject to any disclaimer, the term of this patent is extended or adjusted under 35 U.S.C. 154(b) by 182 days.

(21) Appl. No.: 18/440,856

(22) Filed: Feb. 13, 2024

(65) Prior Publication Data

US 2025/0261340 A1 Aug. 14, 2025

(51) Int. Cl.
*H05K 7/20* (2006.01)
*G06F 1/20* (2006.01)

(52) U.S. Cl.
CPC ........... *H05K 7/20418* (2013.01); *G06F 1/20* (2013.01); *G06F 1/203* (2013.01); *H05K 7/20445* (2013.01); *H05K 7/20481* (2013.01); *H05K 7/20963* (2013.01)

(58) Field of Classification Search
CPC ........... H05K 7/20418; H05K 7/20445; H05K 7/20472; H05K 7/20481; G06F 1/20; G06F 1/203
See application file for complete search history.

(56) References Cited

U.S. PATENT DOCUMENTS

| | | | | |
|---|---|---|---|---|
| 11,899,504 | B2 * | 2/2024 | Chen | G06F 1/1656 |
| 2013/0077217 | A1 * | 3/2013 | Trzaskos | G09F 23/00 361/679.02 |
| 2013/0329367 | A1 * | 12/2013 | Huang | H05K 7/20445 361/704 |
| 2016/0066454 | A1 * | 3/2016 | Hill | H04M 1/0283 156/60 |
| 2020/0006187 | A1 * | 1/2020 | Otremba | H01L 23/433 |
| 2021/0378135 | A1 * | 12/2021 | Wang | G06F 1/20 |
| 2023/0012108 | A1 * | 1/2023 | Choi | G06F 1/203 |
| 2024/0015935 | A1 * | 1/2024 | Chen | H10K 59/87 |

* cited by examiner

*Primary Examiner* — Jayprakash N Gandhi
*Assistant Examiner* — Steven Ngo
(74) *Attorney, Agent, or Firm* — BAKERHOSTETLER

(57) ABSTRACT

An indicium (e.g., logo) for an electronic device includes multiple layers of material bonded together, with at least one of the layers having a relatively higher thermal conductivity than the other layers. Using the layer with the higher thermal conductivity, the indicium may direct heat away from a heat-generating component and distribute the heat to a housing of the electronic device. In order to provide a particular appearance, the indicium may include a layer that covers the relatively higher thermally conductive layer. Based on the higher thermally conductive layer, the indicium may limit or prevent heat flow through the layer covering the thermally conductive layer.

19 Claims, 10 Drawing Sheets

ELECTRONIC DEVICES INCLUDING AN INDICIUM WITH A THERMAL CONDUIT

TECHNICAL FIELD

This application is directed to electronic devices, and more particularly, to electronic devices with an indicium with thermally conductive features.

BACKGROUND

Electronic devices, including portable electronic devices, include an integrated circuit used to generate and/or manage several operations. Based on its evolving technology, integrated circuits may perform several additional operations, including higher complexity operations. Based on the additional and/or complex operations performed, integrated circuits tend to convert more electrical energy into heat (e.g., thermal energy).

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
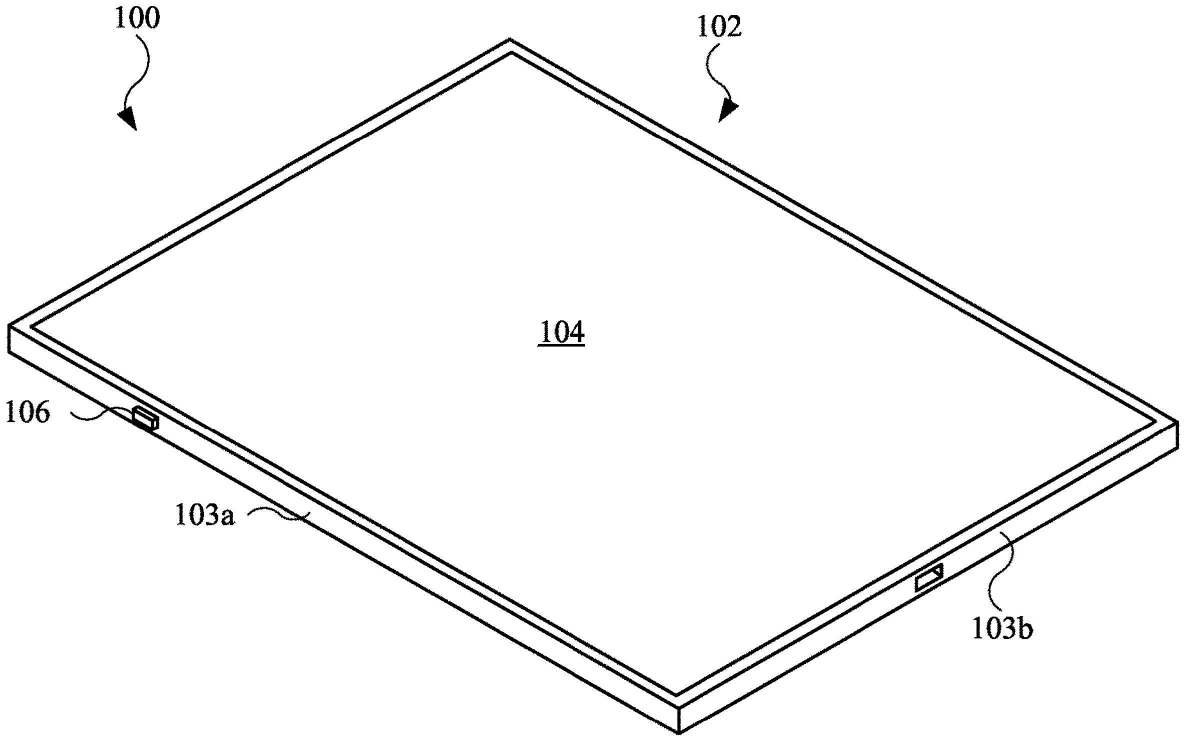
FIG. 1 illustrates a front perspective view of an example of an electronic device, in accordance with aspects of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The present disclosure is directed to indicia (e.g., logos, symbols, or the like) with heat distribution capabilities. In particular, an indicium described herein may include multiple layers of material used to receive (e.g., absorb) heat from a heat-generating component (e.g., integrated circuit) in an electronic device and direct the heat away from the heat-generating component. In one or more implementations, one of the layers defines an external cosmetic external layer, another layer takes the form of a thermally conductive layer, and yet another layer takes the form of a support layer. Based on the heat absorbing capabilities, the indicium may function not only provide aesthetics (e.g., as a logo) for an electronic device, but also as a heat sink.

The thermally conductive layer may be positioned between the cosmetic layer and the support layer. When integrated into a housing of an electronic device, the support layer may couple, or secure, with the housing, thus placing the support layer closest to the heat-generating component and placing the cosmetic layer furthest from the heat-generating component. In this regard, when the indicium receives heat, at least some of the heat transmitted through the support layer is received by the thermally conductive layer, where the thermally conductive layer directs the received heat to the housing. When the housing includes a metal (e.g., aluminum), the heat received from the housing can be distributed throughout other locations (e.g. other locations of the housing). The thermally conductive layer may limit or prevent heat from being transmitted to the cosmetic layer, which defines a layer in which a user of the electronic device may contact. Beneficially, users of the electronic device are less likely to experience the indicium at elevated temperatures, thus reducing the likelihood of injury.

Further, at least some of the layers may include dissimilar materials. For example, the cosmetic layer and the support layer may each include steel (e.g., SUS316 stainless) and the thermally conductive layer may include copper. In order to bond the dissimilar layers together, a cladding operation may be used. Using the cladding operation, each of the layers of the indicium may be extruded through a die and pressed or rolled together under pressure.

While various examples and embodiments show and describe an indicium, other structural components with both aesthetic and heat-sinking capabilities may be contemplated. For example, electronic devices such as desktop computing devices, electronic devices with a display and a stand, or standalone displays may include a handle to facilitate carrying the electronic device. In one or more implementations, the handle may include a thermally conductive layer (e.g. copper) thermally coupled to a heat-generating component, as well as an aesthetic layer (e.g., stainless steel) covering the thermally conductive layer. As yet another example, a retractable holder that can be coupled (e.g., magnetically coupled) to an electronic device to allow a user to hold the electronic device may include a thermally conductive layer (e.g. copper) thermally coupled to a heat-generating component, as well as an aesthetic layer (e.g., stainless steel) covering the thermally conductive layer.

These and other embodiments are discussed below with reference to FIGS. 1-14. However, those skilled in the art will readily appreciate that the detailed description given herein with respect to these Figures is for explanatory purposes only and should not be construed as limiting.

FIG. 1 illustrates a front perspective view of an example of an electronic device 100, in accordance with aspects of the present disclosure. In one or more implementations, electronic device 100 takes the form of a handheld computing device, such as a laptop computing device. In the exemplary embodiment shown in FIG. 1, electronic device 100 takes the form of a handheld computing device, such as a mobile wireless communication device, such as a smartphone or a tablet computing device. Electronic device 100 may take the form of other devices, such as desktop computing devices or standalone displays.

Electronic device 100 may include a housing 102, or enclosure, designed to provide a volume (e.g., internal volume) to carry several components of electronic device 100. In this regard, housing 102 may include several walls, including a bottom wall and several sidewalls extending from the bottom wall. For example, housing 102 includes a sidewall 103*a* and a sidewall 103*b*, each representative of additional sidewalls of housing 102. Although not shown in FIG. 1, some of the components may include a processing circuitry (e.g., central processing unit or CPU, graphics processing unit or GPU, application-specific integrated circuit or ASIC, system on chip or SOC), memory circuitry (e.g., read-only memory, random access memory), one or more batteries, one or more audio transducers (e.g., microphone, speaker), flexible circuitry, a wireless charging module, or a combination thereof, as non-limiting examples.

Electronic device 100 may further include a display 104. As non-limiting examples, display 104 may take the form of a liquid crystal display (LCD), a light-emitting diode (LED) display, or an organic light-emitting diode (OLED) display. Accordingly, display 104 is designed to present visual information in the form of textual information, still images, motion images (e.g., video), or a combination thereof. Also, display 104 may be covered by a transparent layer (not shown in FIG. 1) formed from a material such as a glass, sapphire, or plastic.

Electronic device 100 may further include one or more input mechanisms. For example, electronic device 100 includes an input mechanism 106 (representative of one or more additional input mechanisms). As non-limiting examples, input mechanism 106 may take the form of a button, a switch, a dial, or a combination thereof. Although input mechanism 106 is located on (e.g., through an opening of) sidewall 103*a*, input mechanism 106 may be located in other areas of sidewall 103*a* and/or on other sidewalls of housing 102.

Figure 2:
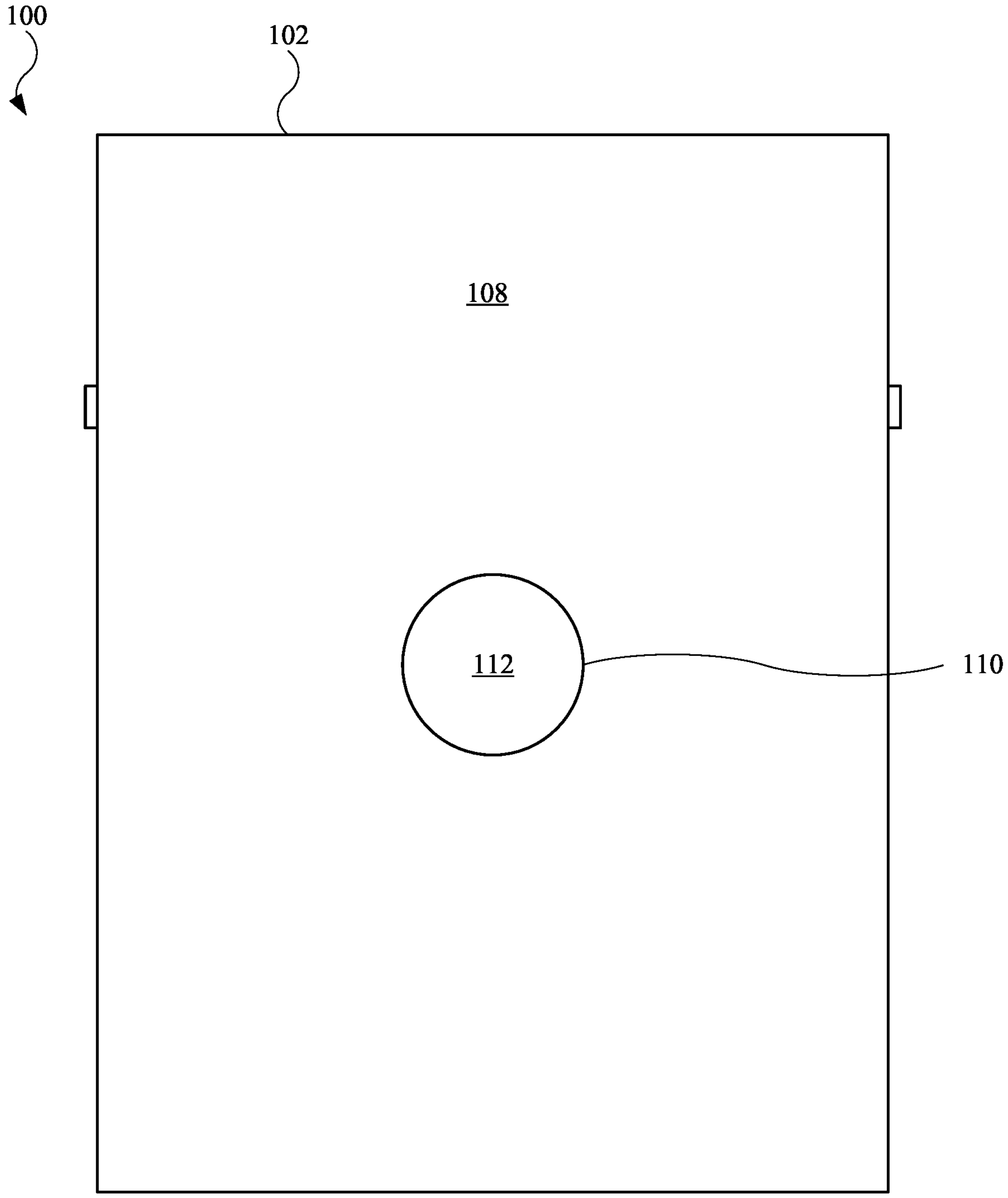
FIG. 2 illustrates a rear plan view of an electronic device, in accordance with aspects of the present disclosure.

FIG. 2 illustrates a rear plan view of electronic device 100, in accordance with aspects of the present disclosure. As shown, housing 102 includes a wall 108, which may take the form of a bottom wall of housing 102. As shown, wall 108 of housing 102 includes an opening 110. Further, electronic device 100 includes an indicium 112 positioned in opening 110 of wall 108. In one or more implementations, indicium 112 takes the form of a logo identifying, for example, the manufacturer of electronic device 100, with the logo being representative of a symbol, one or more letters, or a combination thereof. While indicium 112 is shown in FIG. 2 as a generally circular object, indicium 112 is exemplary and may take different shapes and sizes. Also, opening 110 may include a corresponding size and shape of indicium 112.

Figure 3:
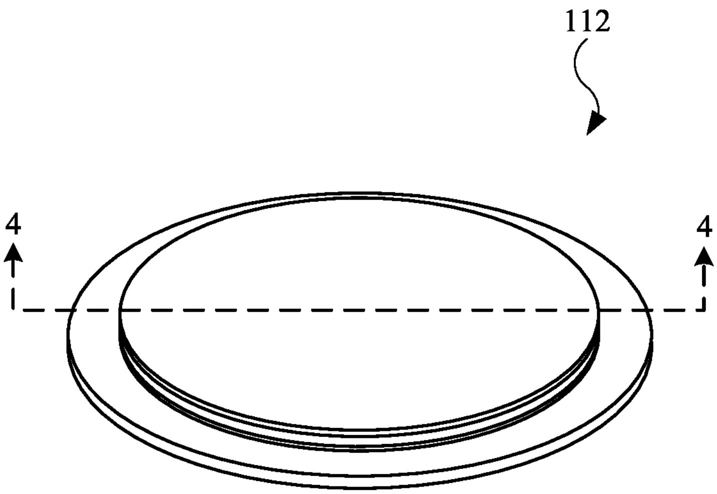
FIG. 3 illustrates a perspective view of an example of an indicium, in accordance with aspects of the present disclosure.

FIG. 3 illustrates a perspective view of an example of indicium 112, in accordance with aspects of the present disclosure. Indicium 112 may include several layers, with at least some layers varying in terms of material makeup, thermal conductivity, thermal expansion coefficient, or a combination thereof. Based at least in part on the use of different layers, indicium 112 may provide various functions, including appearance, heat sinking, heat distribution, and structural support, as non-limiting examples.

Figure 4:
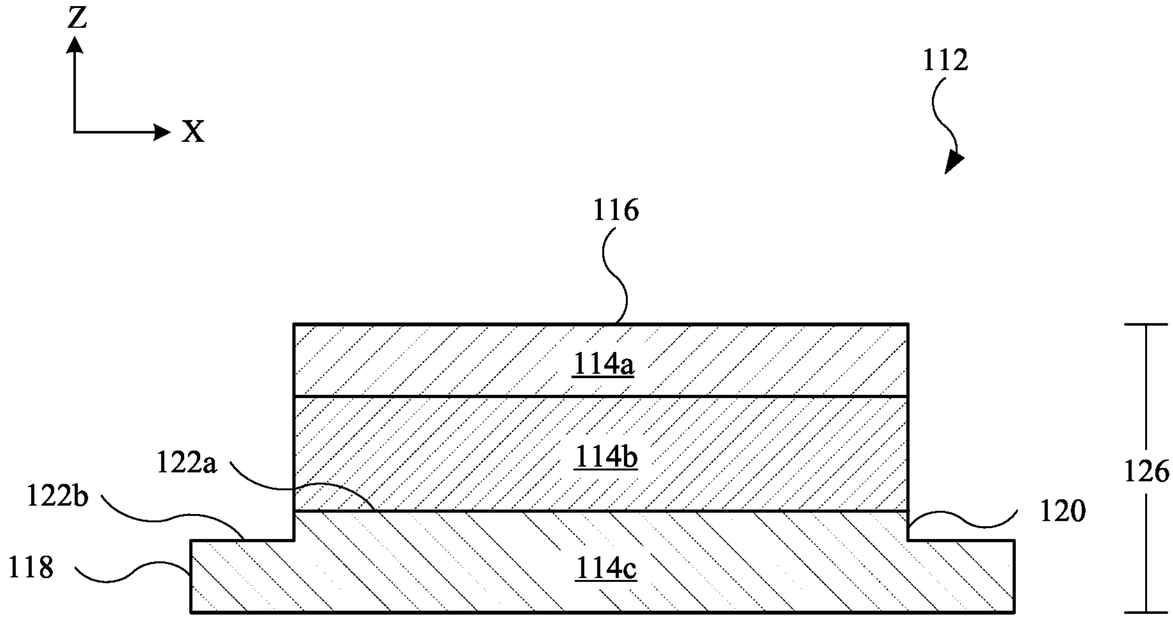
FIG. 4 illustrates a cross sectional view of the indicium shown in FIG. 3, taken along line 4-4 in FIG. 3, in accordance with aspects of the present disclosure.

FIG. 4 illustrates a cross sectional view of indicium 112 shown in FIG. 3, taken along line 4-4 in FIG. 3, in accordance with aspects of the present disclosure. As shown, indicium 112 includes several layers, such as a layer 114*a*, a layer 114*b*, and a layer 114*c*. While layers 114*a*, 114*b*, and 114*c* represent a discrete number (e.g., three) of layers, the number of layers of indicium 112 may vary in other example implementations.

In one or more implementations, each of layers 114*a*, 114*b*, and 114*c* take the form of a metal layer. For example, layer 114*a* may include a stainless steel layer, including SUS316 stainless steel as a non-limiting example. Additionally, layer 114*b* may include a copper layer. Also, layer 114*c* may include a stainless steel layer, including SUS316 stainless steel as a non-limiting example. In this regard, at least some layers may include a different material.

Based on the use of different materials, some layers of indicium 112 may include different properties. For example, layers 114*a* and 114*b* may include different thermal conductivity. When taking the form of stainless steel, layer 114*a* may include an approximate thermal conductivity of 16.3 Watts per meter per Kelvin (W/m*K). Further, when taking the form of copper, layer 114*b* may include an approximate thermal conductivity of 398 W/m*K. Also, when layer 114*c* is formed from the same material as that of layer 114*a*, layer 114*c* may have the same or substantially similar thermal conductivity as that of layer 114*a*. Based on the disparate thermal conductivities, indicium 112, and in particular, layer 114*b*, may be designed to receive and distribute heat in a particular manner. Conversely, some layers (e.g., layer 114*a*) may be thermally resistant as compared to other layers (e.g., layer 114*b*). This will be shown and described in further detail below.

Additionally, when layers 114*a* and 114*c* include the same material(s), layers 114*a* and 114*c* may include the same or substantially similar thermal expansion coefficient and stiffness. In this regard, layers 114*a* and 114*c* may expand in the same or similar manner in response to receiving heat. Beneficially, layers 114*a* and 114*c*, when having the same material makeup, may apply the same or substantially similar forces to layer 114*b*, thus minimizing or preventing layer 114*b* from unwanted bending.

When integrated into a housing of an electronic device (e.g., housing 102 of electronic device 100 shown in FIG. 2), indicium 112 may be oriented such that a surface 116 of layer 114*a* is visible to a user. In this regard, surface 116 may represent an exterior surface (e.g., cosmetic surface) of layer 114*a*, as well as an exterior surface of indicium 112.

Also, layer 114*c* may include a flange portion 118, or flange, configured to couple with a housing (e.g., housing 102 shown in FIG. 2). Flange portion 118 may provide additional lateral material for layer 114*c* as compared to layers 114*a* and 114*b*. As a result, layer 114*c* may provide a receiving surface for indicium 112 to couple with a housing. Also, based on the use of stainless steel, layer 114*c* may provide a rigid support layer for indicium 112. Further, layer 114*c* may include a stepped portion 120 that provides for surfaces of layer 114*c* with different elevated portions. For example, based on stepped portion 120, layer 114*c* may include a surface 122*a* and a surface 122*b* (defined by flange portion 118), with surfaces 122*a* and 122*b* having different elevations, as measured with respect to a Z-axis of Cartesian coordinates. As shown, surface 122*a* is elevated with respect to surface 122*b*.

Indicium 112 may be formed through various operations. For example, each of layers 114*a*, 114*b*, and 114*c* may be machined from respective layers of material, and subsequently pressed together through a cladding operation. Other operations (e.g., welding) may be used to couple layers 114*a*, 114*b*, and 114*c* together. Also, subsequent to coupling layers 114*a*, 114*b*, and 114*c* together, indicium 112 may include a dimension 126 (e.g., height) approximately in the range of 0.4 millimeters to 0.8 mm. In one or more implementations, dimension 126 is 0.6 mm. Also, while each of layers 114*a*, 114*b*, and 114*c* is generally flat or planar, at least some of layers 114*a*, 114*b*, and 114*c* may be bent through an operation, such as stamping.

Alternatively, at least some of layers 114*a*, 114*b*, and 114*c* may include different materials. For example, at least one of layer 114*a* or layer 114*c* may include molybdenum or titanium. Additionally, layer 114*a* may include one or more non-metals. For example, layer 114*a* may include diamond (including synthetic diamond), carbon fiber, or ceramic. Additionally, layer 114*b* may include materials such as aluminum, as a non-limiting example.

Figure 5A:
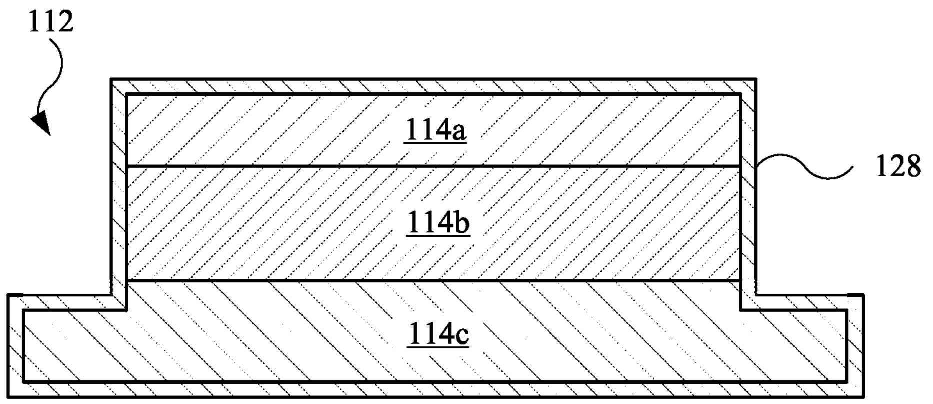
FIG. 5A, FIG. 5B, and FIG. 5C illustrate an example process for providing additional operations and/or layers to an indicium, in accordance with aspects of the present disclosure.
Figure 5B:
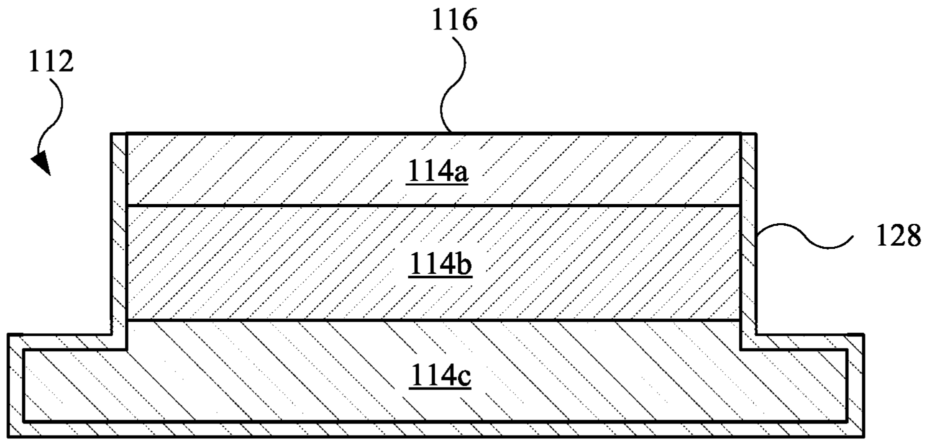
Figure 5C:
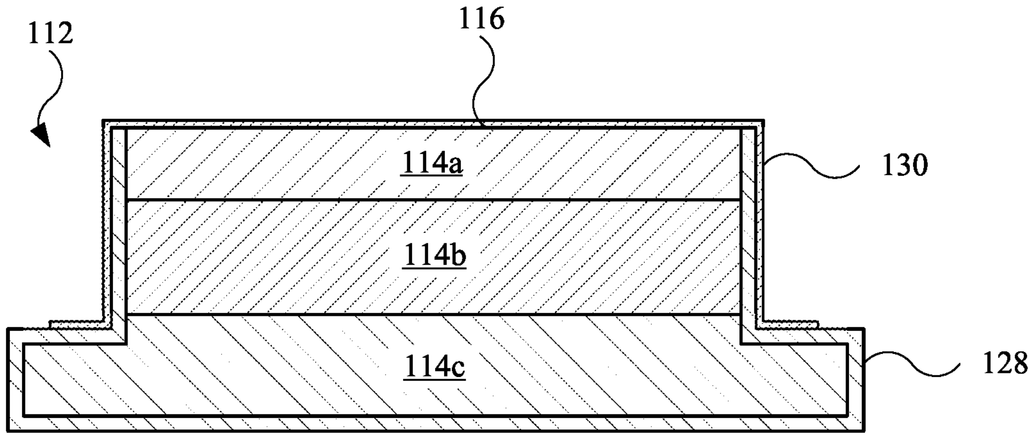

FIG. 5A, FIG. 5B, and FIG. 5C illustrate an example process for providing additional operations and/or layers to indicium 112, in accordance with aspects of the present disclosure. Referring to FIG. 5A, a coating 128 may be applied to indicium 112, including to each of layers 114*a*, 114*b*, and 114*c*. In one or more implementations, coating 128 takes the form of a nickel-based coating, including an electroless nickel plating. In this regard, coating 128 may provide protection against issues such as corrosion due to liquid ingress, particularly when layer 114*b* includes copper.

Referring to FIG. 5B, at least some of coating 128 may be removed from portions of indicium 112. For example, coating 128 may be removed from surface 116 of layer 114*a*, while remaining on several surfaces of layers 114*b* and 114*c*. In one or more implementations, a lapping operation is used to remove coating 128 and expose surface 116.

Referring to FIG. 5C, a coating 130 may be applied to portions of indicium 112. For example, coating 130 may be applied to surface 116 of layer 114*a* as well as to coating 128, including regions of coating 128 that cover layers 114*b* and 114*c*. In one or more implementations, a physical vapor deposition (PVD) operation is used to apply coating 130.

Figure 6:
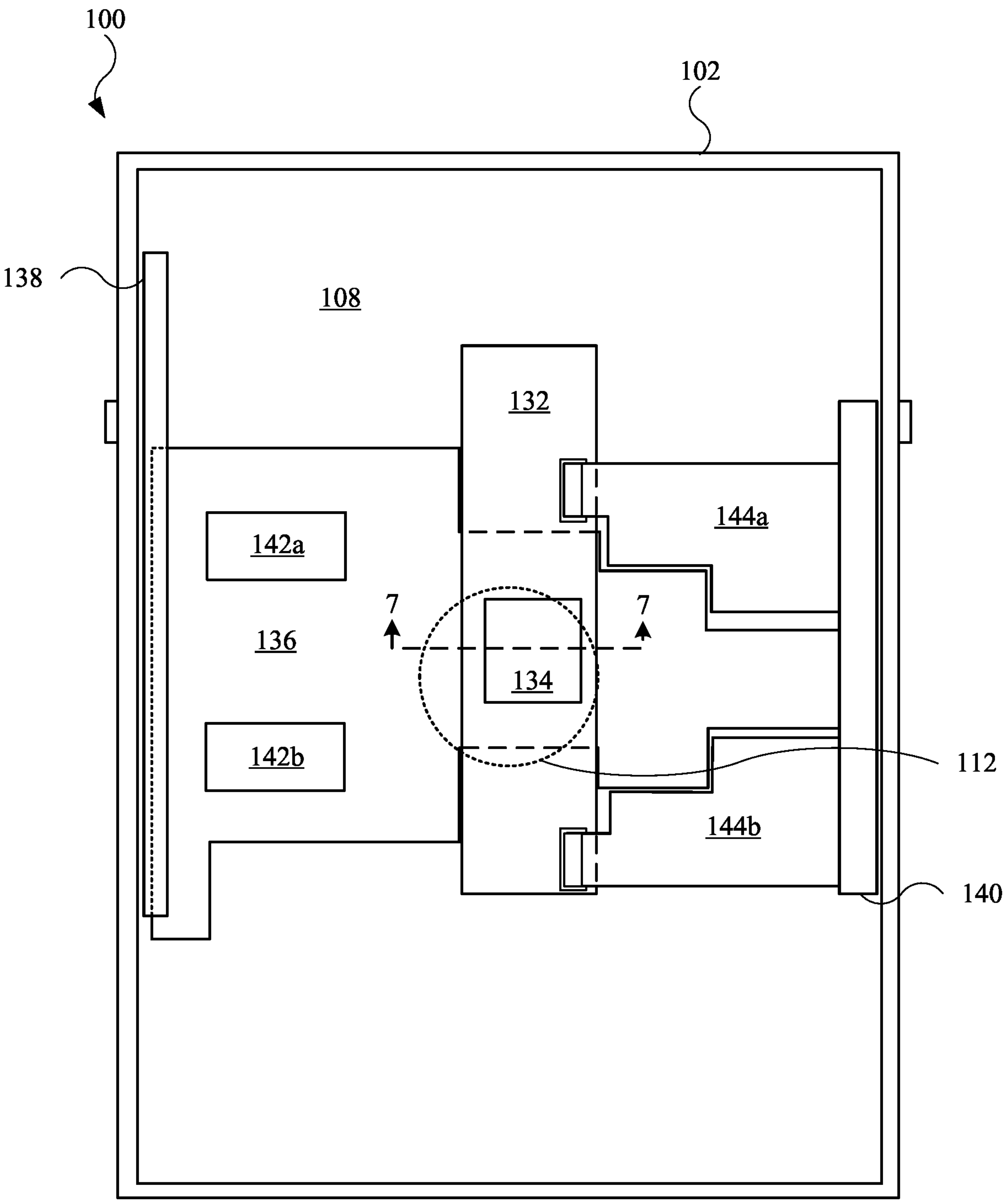
FIG. 6 illustrates a front plan view of an example of an electronic device, showing several internal features of the electronic device, in accordance with aspects of the present disclosure.

FIG. 6 illustrates a front plan view of an example of electronic device 100, showing several internal features of electronic device 100, in accordance with aspects of the present disclosure. For purposes of illustration, display 104 (shown in FIG. 1) is removed. As shown, electronic device 100 may include a circuit board 132 and a heat-generating component 134 positioned within housing 102 (e.g., within an internal volume defined by housing 102). As a non-limiting example, circuit board 132 may take the form of a logic board. Also, heat-generating component 134 may take the form of a CPU, a GPU, an ASIC, or an SOC, as non-limiting examples.

As shown, both indicium 112 (shown as a dotted line) and heat-generating component 134 are centrally located in electronic device 100. For example, indicium 112 is located at a center, or approximate center, of wall 108 of housing 102, and heat-generating component 134 is located at a center, or approximate center, of the internal volume defined by housing 102. Accordingly, heat-generating component 134 may be aligned with indicium 112, thus positioning heat-generating component over (in the view shown in FIG. 6), or at least substantially over, indicium 112. As a result of the alignment between indicium 112 and heat-generating component 134, when heat-generating component 134 generates heat, at least some of the heat may flow into indicium 112.

In order to distribute heat from heat-generating component 134 and/or other heat-generating components (not shown in FIG. 6), electronic device 100 may further include a layer 136. As a non-limiting example, layer 136 may include graphite. In this regard, layer 136 may receive and distribute heat from, for example, heat-generating component 134. As shown, layer 136 may be positioned between heat-generating component 134 and indicium 112.

Layer 136 may thermally couple with several components of electronic device 100, thus allowing layer 136 to receive heat from the components. For example, layer 136 may thermally couple with a circuit board 138, which may take the form of a timing controller board for display 104 (shown in FIG. 1). Additionally, layer 136 may thermally couple with one or more components 140. As non-limiting examples, one or more component 140 may include a wireless charging module and electrical contacts.

Further, layer 136 may include a design layout to not only provide heat distribution but also to accommodate various components of electronic device 100. For example, layer 136 may include an opening 142*a* and an opening 142*b*. Openings 142*a* and 142*b* of layer 136 may provide space for an adhesive used to secure a battery (not shown in FIG. 6). Additionally, portions of layer 136 may be removed to accommodate a circuit 144*a* and a circuit 144*b*. Each of circuits 144*a* and 144*b* may take the form of a flexible circuit that electrically couples one or more components 140 with circuit board 132, thus electrically coupling one or more components 140 with other components on circuit board 132 (e.g., heat-generating component 134).

Figure 7:
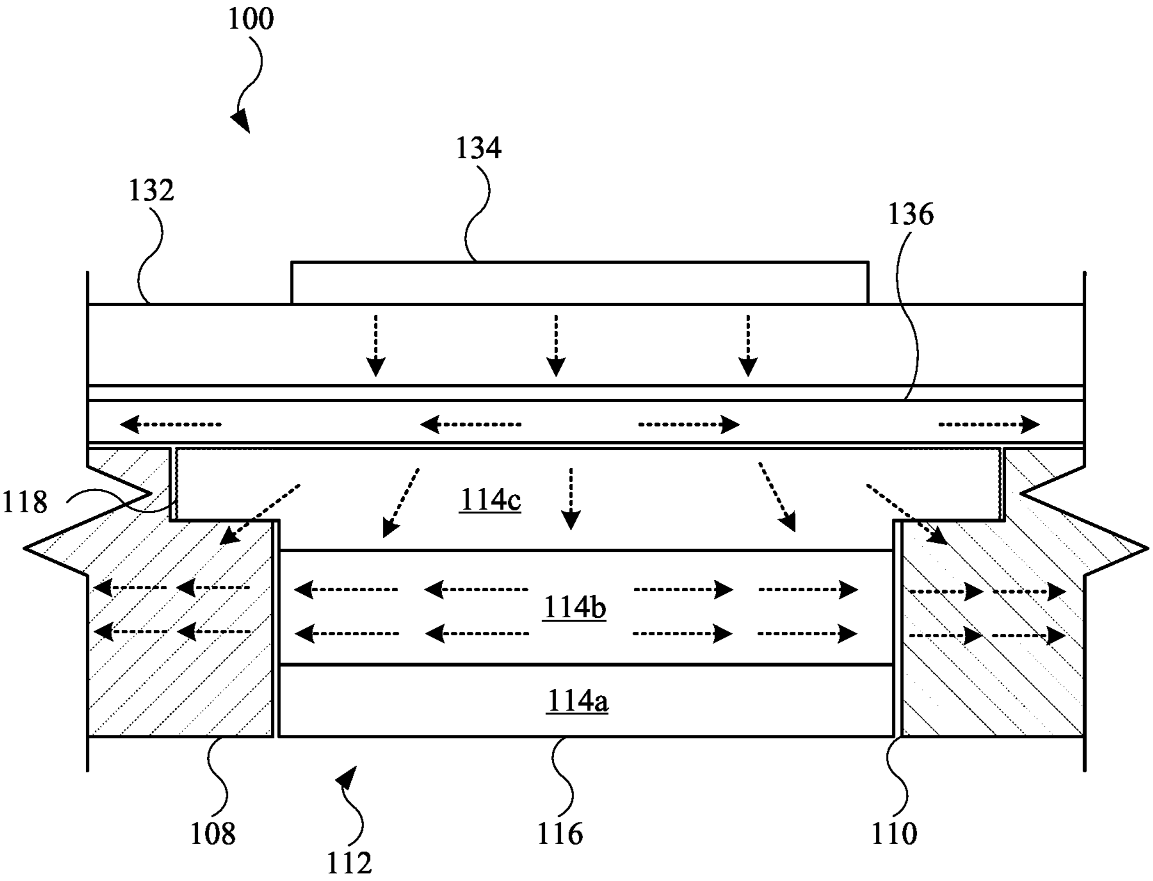
FIG. 7 illustrates a partial cross sectional view of the electronic device shown in FIG. 6, taken along line 7-7 in FIG. 6, showing heat distribution among components within the electronic device, in accordance with aspects of the present disclosure.

FIG. 7 illustrates a partial cross sectional view of electronic device 100 shown in FIG. 6, taken along line 7-7 in FIG. 6, showing heat distribution among components within electronic device 100, in accordance with aspects of the present disclosure. Although not shown, an adhesive may be used to couple flange portion 118 of indicium 112 with wall 108. Several dotted lines are used to represent the flow of heat, which may be generated by heat-generating component 134. During operation, at least some heat generated by heat-generating component 134 may flow through circuit board 132 and into layer 136. As a result, layer 136 may distribute at least some of the heat away from heat-generating component 134 and throughout wall 108.

Based on the alignment between indicium 112 and heat-generating component 134, indicium 112 may receive at least some of the heat passing through layer 136. For example, heat may initially flow into layer 114*c* of indicium 112. While layer 114*c* may distribute at least some of the received heat into wall 108, layer 114*b* may receive heat from layer 114*c*. Based on layer 114*b* having a relatively high thermal conductivity as compared to layers 114*a* and 114*c*, layer 114*b* may readily distribute the received heat from layer 114*c* to wall 108. Moreover, layer 114*b* may substantially distribute the received heat, thus directing the heat away from surface 116 of layer 114*a* so as to minimize or prevent surface 116 of layer 114*a* from receiving heat. Beneficially, a user making contact with surface 116 of layer 114*a* may experience little, if any heat, generated by heat-generating component 134, even in instances when heat-generating component 134 is positioned over, and in some instances directly over, indicium 112 as shown in FIG. 7.

Based in part on material makeup, indicium 112 may be positioned at or along an exterior of electronic device 100. For example, as shown in FIG. 7, layer 114*a* (e.g., a cosmetic layer) includes a surface 116 that is flush with respect to a surface of wall 108 and generally visible to users of electronic device 100. Further, based on the position of indicium 112 within the opening 110 of wall 108, indicium 112 may be integrated housing 102 (shown in FIG. 2). Put another way, housing 102 may include indicium 112 as a component of housing 102. Moreover, the material makeup of indicium 112 further allows indicium 112 to function as a heat sink, as layers 114*b* and 114*c* receive heat from heat-generating component 134 as well as limit or prevent heat from being transmitted to surface 116 of layer 114*a*.

FIGS. 8-12 show and describe alternate embodiments of an indicium. The indicia shown and/or described in FIGS. 8-12 may include at least some features previously shown and/or described for indicium 112 (e.g., shown in FIG. 3), including the material makeup of the layers of indicium 112. Further, in some example implementations, indicium 112 may be modified to include at least some features shown and/or described for indicia in FIGS. 8-12.

Figure 8:
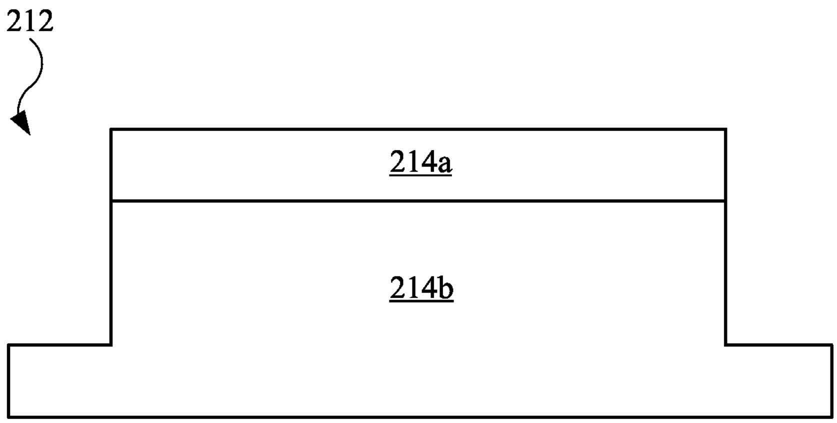
FIG. 8, FIG. 9, and FIG. 10 illustrate side views of alternate embodiments of an indicium, showing the indicium having a different number of materials, in accordance with aspects of the present disclosure.
Figure 9:
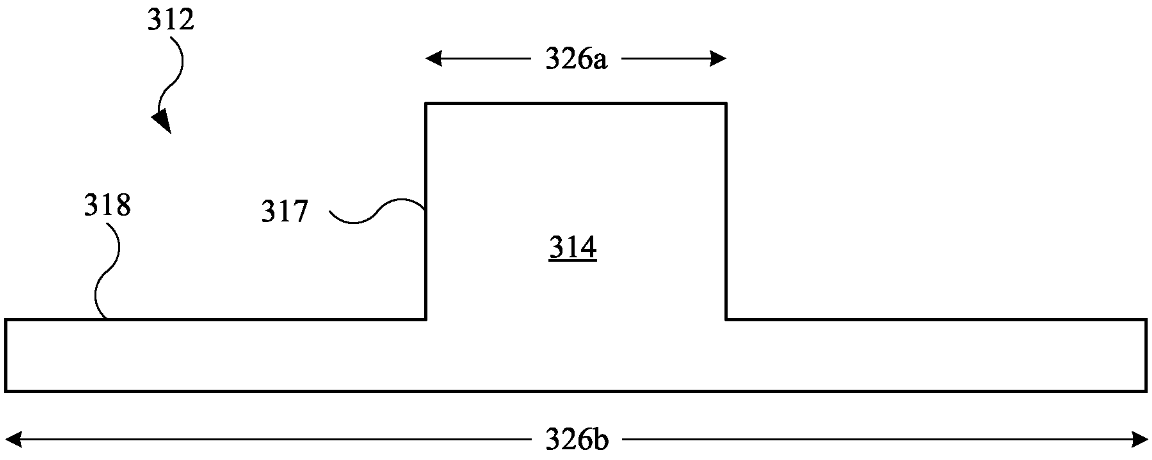
Figure 10:
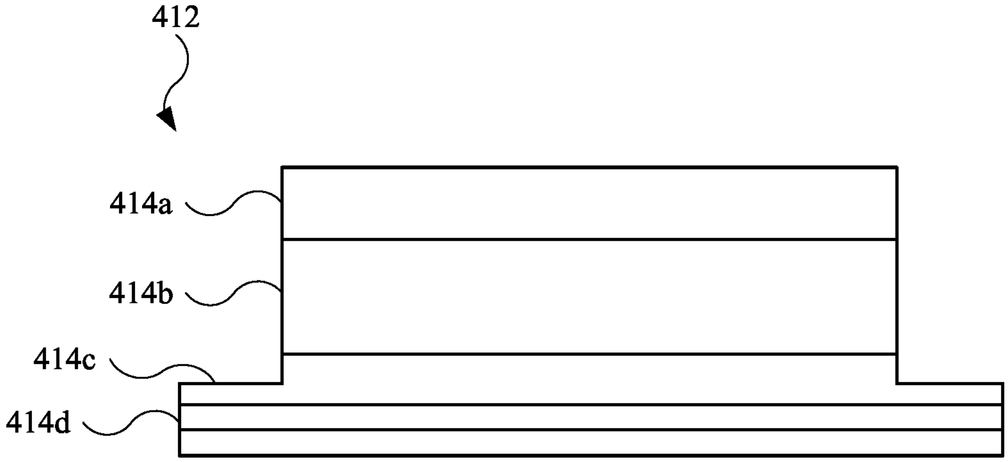

FIG. 8, FIG. 9, and FIG. 10 illustrate side views of alternate embodiments of an indicium, showing the indicium having a different number of materials, in accordance with aspects of the present disclosure. Referring to FIG. 8, an indicium 212 includes a layer 214*a* and a layer 214*b*. Layer 214*a* may provide a cosmetic exterior for indicium 212, and may include a material such as stainless steel. Layer 214*b* may provide heat distribution, and may include a material such a copper. Accordingly, indicium 212 may include fewer than three layers.

Referring to FIG. 9, an indicium 312 includes a layer 314, with layer 314 representing a single layer of material of indicium 312. As shown, layer 314 includes an exterior portion 317 and a flange portion 318, with exterior portion 317 and flange portion 318 having a dimension 326*a* (e.g., width) and a dimension 326*b* (e.g., width), respectively. As shown, dimension 326*b* is greater than dimension 326*a*. In one or more implementations, dimension is 5 or more times greater than dimension 326*a*. As a result, flange portion 318 provides additional material through which heat may flow. In this regard, layer 314 may be formed from a material with a more desirable finish (e.g., stainless steel) despite having a relatively lower thermal conductivity than other materials. However, the additional material from flange portion 318 provides for additional heat absorption. Accordingly, indicium 312 may include fewer than two layers.

Referring to FIG. 10, an indicium 412 includes a layer 414*a*, a layer 414*b*, a layer 414*c*, and a layer 414*d*. As non-limiting examples, each of layers 414*a* and 414*c* includes stainless steel, and layer 414*b* includes copper. Layer 414*d* may include a non-metal thermally conductive layer, such as graphite. Graphite may include a relatively high thermal conductivity, such as 800 W/m*K or greater. By integrating layer 414*d* into layer 414*c*, the overall thermal conductivity of indicium 412 may increase.

Figure 11:
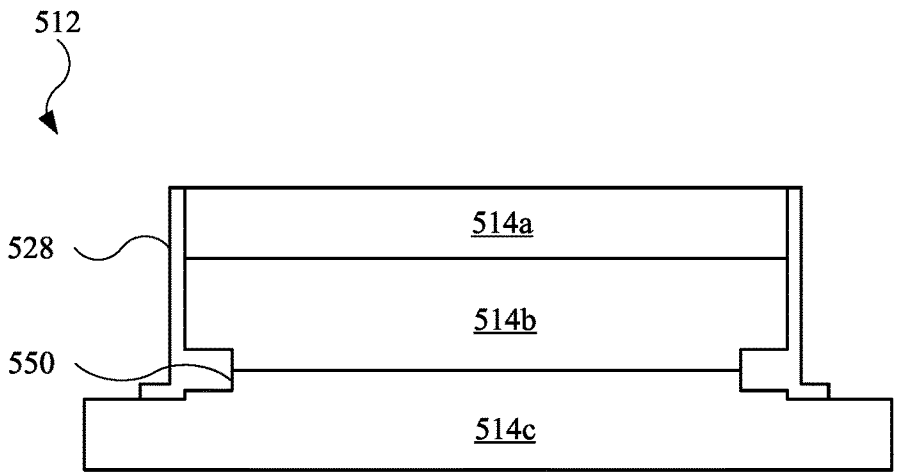
FIG. 11 illustrates a side view of an alternate embodiment of an indicium, showing the indicium having an undercut and a coating positioned in the undercut, in accordance with aspects of the present disclosure.

FIG. 11 illustrates a side view of an alternate embodiment of an indicium 512, showing indicium 512 having an undercut 550 and a coating 528 positioned in undercut 550, in accordance with aspects of the present disclosure. As shown, indicium 512 includes a layer 514*a*, a layer 514*b*, and a layer 514*c*. As non-limiting examples, each of layers 514*a* and 514*c* includes stainless steel, and layer 514*b* includes copper. Coating 528 may be applied to indicium 512, including to at least some surfaces of each of layers 514*a*, 514*b*, and 514*c*. In one or more implementations, coating 528 takes the form of a thermoplastic coating. In this regard, coating 528 may provide protection against issues, such as corrosion, particularly when layer 514*b* includes copper. Additionally, coating 528 may provide other functions, such as insulation. Undercut 550 may provide a location into which coating 528 is positioned, thus forming a mechanical interlock with layers 514*a*, 514*b*, and 514*c*. While undercut 550 is shown as a material removal of layer 514*b* and 514*c*, the material removal operation used to form undercut 550 may alternatively be performed to one of layer 514*b* or layer 514*c*.

Figure 12:
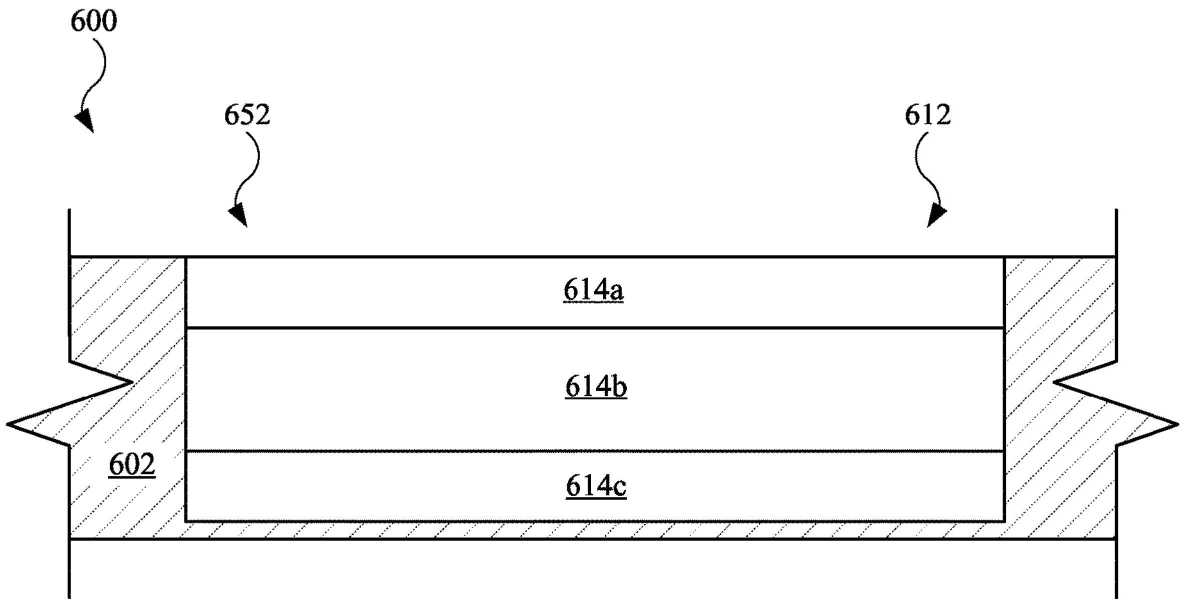
FIG. 12 illustrates a partial cross sectional view of an electronic device, showing an indicium positioned in a pocket of a housing of the electronic device, in accordance with aspects of the present disclosure.

FIG. 12 illustrates a partial cross sectional view of an electronic device 600, showing an indicium 612 positioned in a pocket 652 of a housing 602 of electronic device 600, in accordance with aspects of the present disclosure. As shown, indicium 612 includes a layer 614*a*, a layer 614*b*, and a layer 614*c*. As non-limiting examples, each of layers 614*a* and 614*c* includes stainless steel, and layer 614*b* includes copper. Pocket 652 may take the form of a cavity or blind hole formed in housing 602 to receive indicium 612. In this regard, layer 614*c* may not require a flange portion (e.g., flange portion 118 shown in FIG. 4), and indicium 612 may be formed with less complexities. Based on the position of indicium 612 relative to a heat-generating component (not shown in FIG. 12), indicium 612 may nonetheless receive heat from the heat-generating component despite pocket 652 not forming a through hole through housing 602.

Figure 13:
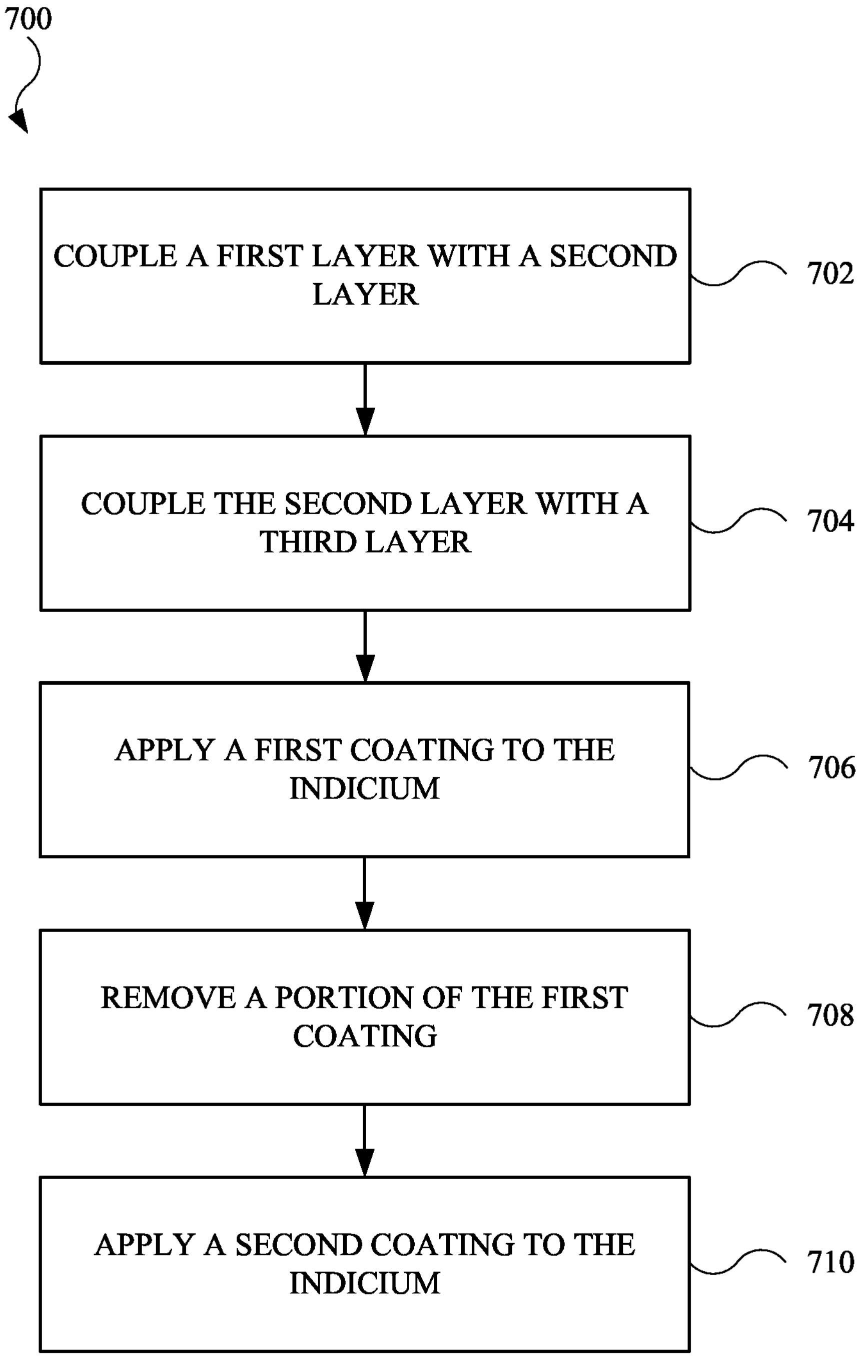
FIG. 13 illustrates a flow diagram showing an example of a process that may be performed for assembling an indicium, in accordance with aspects of the present disclosure.

FIG. 13 illustrates a flow diagram showing an example of a process 700 that may be performed for assembling an indicium, in accordance with aspects of the present disclosure. For explanatory purposes, process 700 shown in FIG. 13 is primarily described herein with reference to indicia for electronic devices, which may include indicium 112 (shown in FIGS. 2-7). However, process 700 shown in FIG. 13 is not limited to indicium 112, and one or more blocks (or operations) of process 700 may be performed to assemble one or more other indicia shown and/or described herein (e.g., shown in FIGS. 8-12). Further, for explanatory purposes, some of the blocks of process 700 are described herein as occurring in serial, or linearly. However, multiple blocks of process 700 may occur in parallel. In addition, the blocks of process 700 need not be performed in the order shown and/or one or more blocks of process 700 need not be performed and/or can be replaced by other operations.

At block 702, a first layer is coupled with a second layer. In one or more implementations, the first layer is from stainless steel and the second layer is formed from copper. However, several exemplary materials, including metals and non-metals, described herein may be substituted. Also, the first layer may form an exterior, including an exterior surface, visible to a user, while the second layer may include a relatively high thermally conductive layer.

At block 704, the second layer is coupled with a third layer. The third layer may provide a support layer for the indicium. In one or more implementations, the third layer is from stainless steel. However, several exemplary materials, including metals and non-metals, described herein may be substituted. Also, the first layer, the second layer, and the third layer may be coupled together by a cladding operation, as a non-limiting example.

At block 706, a first coating is applied to the indicium. In one or more implementations, the first coating includes a nickel-based coating. In this regard, the first coating may provide corrosion resistance by prevent liquid from contact some layers, including the second layer, particularly when the second layer includes copper.

At block 708, a portion of the first coating is removed. In one or more implementations, the first coating is removed from an exterior surface of the first layer. The removal of the first coating may be performed via lapping operation, as a non-limiting example.

At block 710, a second coating is applied to the indicium. In one or more implementations, the second coating includes a PVD that covers at least some of the first layer (including the exterior surface), the second layer, or the third layer.

Figure 14:
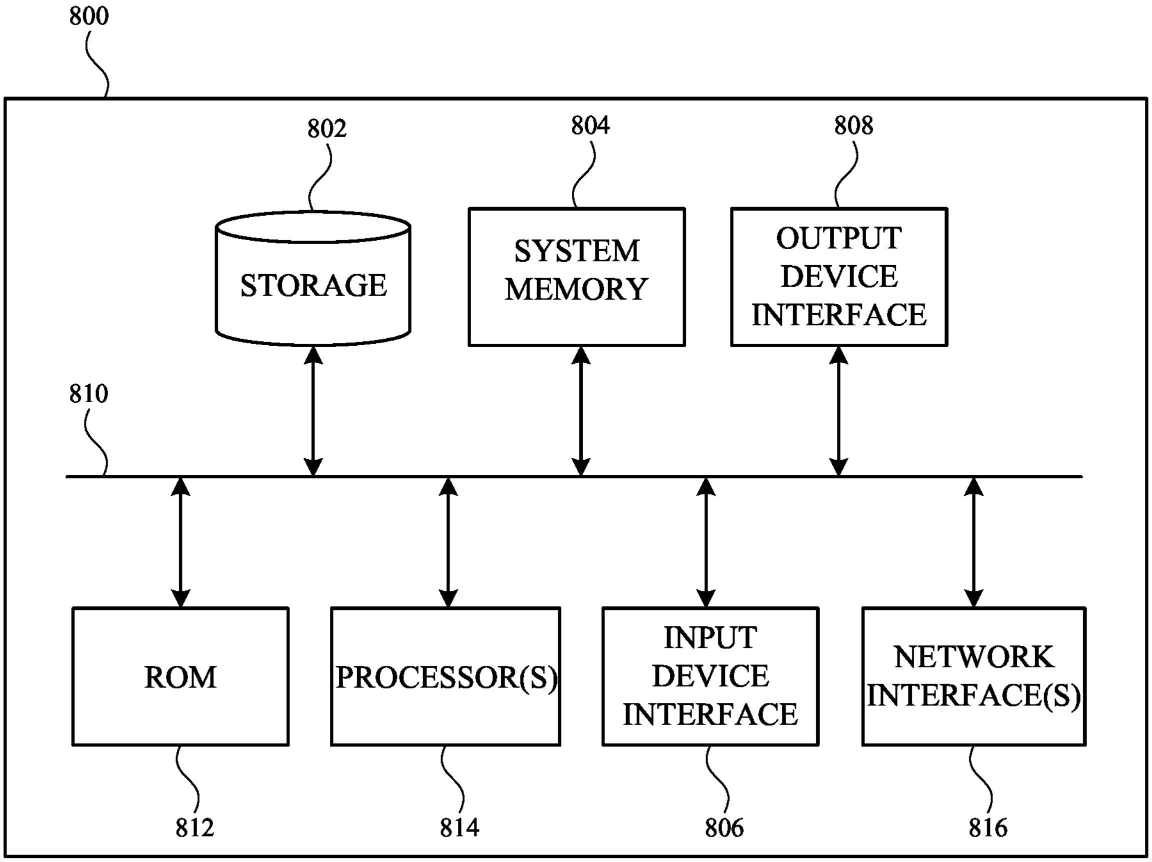
FIG. 14 illustrates an electronic system with which one or more implementations of the subject technology may be implemented.

FIG. 14 illustrates an electronic system with which one or more implementations of the subject technology may be implemented. The electronic system 800 can be, and/or can be a part of, electronic device 100 as shown in FIG. 1. The electronic system 800 may include various types of computer readable media and interfaces for various other types of computer readable media. The electronic system 800 includes a bus 810, one or more processing units 814, a system memory 804 (and/or buffer), a ROM 812, a permanent storage device 802, an input device interface 806, an output device interface 808, and one or more network interfaces 816, or subsets and variations thereof.

The bus 810 collectively represents all system, peripheral, and chipset buses that communicatively connect the numerous internal devices of the electronic system 800. In one or more implementations, the bus 810 communicatively connects the one or more processing units 814 with the ROM 812, the system memory 804, and the permanent storage device 802. From these various memory units, the one or more processing units 814 retrieves instructions to execute and data to process in order to execute the processes of the subject disclosure. The one or more processing units 814 can be a single processor or a multi-core processor in different implementations.

The ROM 812 stores static data and instructions that are needed by the one or more processing units 814 and other modules of the electronic system 800. The permanent storage device 802, on the other hand, may be a read-and-write memory device. The permanent storage device 802 may be a non-volatile memory unit that stores instructions and data even when the electronic system 800 is off. In one or more implementations, a mass-storage device (such as a magnetic or optical disk and its corresponding disk drive) may be used as the permanent storage device 802.

In one or more implementations, a removable storage device (such as a flash drive, and its corresponding disk drive) may be used as the permanent storage device 802. Like the permanent storage device 802, the system memory 804 may be a read-and-write memory device. However, unlike the permanent storage device 802, the system memory 804 may be a volatile read-and-write memory, such as random access memory. The system memory 804 may store any of the instructions and data that one or more processing units 814 may need at runtime. In one or more implementations, the processes of the subject disclosure are stored in the system memory 804, the permanent storage device 802, and/or the ROM 812 (which are each implemented as a non-transitory computer-readable medium). From these various memory units, the one or more processing units 814 retrieves instructions to execute and data to process in order to execute the processes of one or more implementations.

The bus 810 also connects to the input device interface 806 and the output device interface 808. The input device interface 806 enables a user to communicate information and select commands to the electronic system 800. Input devices that may be used with the input device interface 806 may include, for example, alphanumeric keyboards and pointing devices (also called "cursor control devices"). The input device interface 806 may enable, for example, the display of images generated by electronic system 800. Output devices that may be used with the input device interface 806 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 14, the bus 810 also couples the electronic system 800 to one or more networks and/or to one or more network nodes, or through the one or more network interfaces 816. In this manner, the electronic system 800 can be a part of a network of computers (such as a LAN, a wide area network ("WAN"), or an Intranet, or a network of networks, such as the Internet. Any or all components of the electronic system 800 can be used in conjunction with the subject disclosure.

Various examples of aspects of the disclosure are described below as clauses for convenience. These are provided as examples, and do not limit the subject technology.

Clause A: An electronic device may include: a housing that defines an internal volume; a heat-generating component positioned in the internal volume; and an indicium thermally coupled with the heat-generating component and integrated with the housing. The indicium may include: a first layer including a first thermal conductivity; a second layer coupled with the first layer, the second layer including a second thermal conductivity different from the first thermal conductivity; and a third layer coupled with the second layer. The third layer may include a third thermal conductivity different from the second thermal conductivity.

Clause B: An electronic device may include: a heat-generating component; and a housing that defines an internal volume. The heat-generating component may be positioned within the internal volume. The housing may include an opening; and an indicium thermally coupled with the heat-generating component and positioned in the opening. The indicium may include: a first layer including a first material; and a second layer coupled with the first layer. The second layer may include a second material different from the first material. The second metal may be configured to: receive thermal energy from the heat-generating component, and direct at least some of the thermal energy to the housing.

Clause C: An indicium for an electronic device may include: a first metal layer that defines an exterior surface of the electronic device; a second metal layer coupled with the first metal layer; and a third metal layer coupled with the second metal layer. The third metal layer may include a flange portion configured to couple with a housing of the electronic device. The second metal may be configured to: receive thermal energy from the third metal layer, and direct at least some of the thermal energy away from the exterior surface.

One or more of the above clauses can include one or more of the features described below. It is noted that any of the following clauses may be combined in any combination with each other, and placed into a respective independent clause, e.g., clause A, B, or C.

Clause 1: wherein the indicium is thermally coupled with the heat-generating component.

Clause 2: wherein the indicium includes a heat sink for the heat-generating component.

Clause 3: wherein: the second thermal conductivity is greater than the first thermal conductivity, and the second thermal conductivity is greater than the third thermal conductivity.

Clause 4: wherein: the housing includes an opening, and the indicium is positioned in the opening.

Clause 5: wherein the third layer further includes: a first surface coupled with the second layer, and a second surface defined by a flange portion.

Clause 6: wherein the first surface is elevated relative to the second surface.

Clause 7: further including a third layer coupled with the second layer, the third layer including a third material different from the second material.

Clause 8: wherein: the first layer includes a first thermal conductivity, and the second layer includes a second thermal conductivity greater than the first thermal conductivity.

Clause 9: wherein the third layer includes the first thermal conductivity.

Clause 10: wherein: the first material and the third material include stainless steel, and the second material includes copper.

Clause 11: wherein: the first layer includes an exterior surface, and the exterior surface is flush with the housing.

Clause 12: wherein: the heat-generating component includes an integrated circuit, and the indicium is aligned with the integrated circuit.

Clause 13: wherein the second layer is thermally coupled with the heat-generating component and the housing.

Clause 14: wherein: the first metal layer includes a first metal, and the second metal layer includes a second metal different from the first metal.

Clause 15: wherein: the first metal layer includes a first thermal conductivity, and the second metal layer includes a second thermal conductivity greater than the first thermal conductivity.

Clause 16: wherein: the first metal layer includes stainless steel, and the second metal layer includes copper.

Clause 17: wherein the third metal layer includes the first metal.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

As used herein, the phrase “at least one of” preceding a series of items, with the term “and” or “or” to separate any of the items, modifies the list as a whole, rather than each member of the list (i.e., each item). The phrase “at least one of” does not require selection of at least one of each item listed; rather, the phrase allows a meaning that includes at least one of any one of the items, and/or at least one of any combination of the items, and/or at least one of each of the items. By way of example, the phrases “at least one of A, B, and C” or “at least one of A, B, or C” each refer to only A, only B, or only C; any combination of A, B, and C; and/or at least one of each of A, B, and C.

The predicate words “configured to”, “operable to”, and “programmed to” do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

When an element is referred to herein as being “connected” or “coupled” to another element, it is to be understood that the elements can be directly connected to the other element, or have intervening elements present between the elements. In contrast, when an element is referred to as being “directly connected” or “directly coupled” to another element, it should be understood that no intervening elements are present in the “direct” connection between the elements. However, the existence of a direct connection does not exclude other connections, in which intervening elements may be present.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word “exemplary” is used herein to mean “serving as an example, instance, or illustration”. Any embodiment described herein as “exemplary” or as an “example” is not necessarily to be construed as preferred or advantageous over other embodiments. Furthermore, to the extent that the term “include”, “have”, or the like is used in the description or the claims, such term is intended to be inclusive in a manner similar to the term “comprise” as “comprise” is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An electronic device, comprising:

a housing that defines an (i) internal volume and (ii) a wall;

a heat-generating component positioned in the internal volume; and an indicium thermally coupled with the heat-generating component and integrated with the housing, the indicium comprising:

a first layer comprising a first thermal conductivity and defining a visible surface;

a second layer coupled with the first layer, the second layer having a second thermal conductivity different from the first thermal conductivity; and a third layer coupled with the second layer, the third layer comprising:

a flange portion adhesively coupled with the wall; and a stepped portion that engages the second layer, wherein the third layer comprises a third thermal conductivity different from the second thermal conductivity, and the second layer is positioned between the first layer and the third layer;

a first coating applied to (i) a first portion of the first layer, (ii) the second layer, and (iii) the third layer; and a second coating applied to the visible surface of the first layer and a portion of the first coating.

2. The electronic device of claim 1, wherein the indicium comprises a heat sink for the heat-generating component.

3. The electronic device of claim 1, wherein:

the second thermal conductivity is greater than the first thermal conductivity, and the second thermal conductivity is greater than the third thermal conductivity.

4. The electronic device of claim 1, wherein:

the housing comprises an opening, and the indicium is positioned in the opening.

5. The electronic device of claim 1, wherein the third layer further comprises:

a first surface coupled with the second layer, and a second surface defined by the flange portion.

6. The electronic device of claim 5, wherein the first surface is elevated relative to the second surface.

7. An electronic device, comprising:

a heat-generating component;

a housing that defines an internal volume, wherein the heat-generating component is positioned within the internal volume, the housing comprising an opening; and an indicium thermally coupled with the heat-generating component and positioned in the opening, the indicium comprising:

a first layer comprising a first material and defining a visible surface relative to the opening; and a second layer coupled with the first layer, the second layer comprising a second material different from the first material, wherein the second layer is configured to:

receive thermal energy from the heat-generating component, and direct at least some of the thermal energy to the housing; and a third layer comprising a flange that extends laterally relative to the second layer, wherein the indicium is coupled to the housing based on the flange;

a first coating applied to (i) a first portion of the first layer, (ii) the second layer, and (iii) the third layer; and a second coating applied to the visible surface of the first layer and a portion of the first coating.

8. The electronic device of claim 7, wherein the third layer comprises a third material different from the second material.

9. The electronic device of claim 8, wherein:

the first layer comprises a first thermal conductivity, and the second layer comprises a second thermal conductivity greater than the first thermal conductivity.

10. The electronic device of claim 9, wherein the third layer comprises the first thermal conductivity.

11. The electronic device of claim 8, wherein:

the first material and the third material comprise stainless steel, and the second material comprises copper.

12. The electronic device of claim 7, wherein:

the first layer comprises an exterior surface, and the exterior surface is flush with the housing.

13. The electronic device of claim 7, wherein:

the heat-generating component comprises an integrated circuit, and the indicium is aligned with the integrated circuit.

14. The electronic device of claim 7, wherein the second layer is thermally coupled with the heat-generating component and the housing.

15. An indicium for an electronic device, the indicium comprising:

a first metal layer that defines a visible surface of the electronic device;

a second metal layer coupled with, and covered by, the first metal layer; and a third metal layer covered by the second metal layer, the third metal layer comprising:

a flange portion configured to couple with a housing of the electronic device, the flange portion extending laterally with respect to the second metal layer; and a stepped portion elevated with respect to the flange portion and coupled to the second metal layer, wherein the second metal layer is configured to:

receive thermal energy from the third metal layer, and direct at least some of the thermal energy away from the first metal layer;

a first coating applied to (i) a first portion of the first metal layer, (ii) the second metal layer, and (iii) the third metal layer; and a second coating applied to the visible surface of the first metal layer and a portion of the first coating.

16. The indicium of claim 15, wherein:

the first metal layer comprises a first metal, and the second metal layer comprises a second metal different from the first metal.

17. The indicium of claim 16, wherein:

the first metal layer comprises a first thermal conductivity, and the second metal layer comprises a second thermal conductivity greater than the first thermal conductivity.

18. The indicium of claim 16, wherein:

the first metal layer comprises stainless steel, and the second metal layer comprises copper.

19. The indicium of claim 16, wherein the third metal layer comprises the first metal.

* * * * *